United States Patent

Burkhard

[11] Patent Number: 5,912,594
[45] Date of Patent: Jun. 15, 1999

[54] COMPACT CRYSTAL OSCILLATOR HAVING NO LARGE CAPACITOR ELEMENT

[75] Inventor: Dick Burkhard, Hamburg, Germany

[73] Assignee: U.S. Philips Corporation, New York, N.Y.

[21] Appl. No.: 08/952,158

[22] PCT Filed: Mar. 20, 1997

[86] PCT No.: PCT/IB97/00274

§ 371 Date: Nov. 14, 1997

§ 102(e) Date: Nov. 14, 1997

[87] PCT Pub. No.: WO97/36369

PCT Pub. Date: Oct. 2, 1997

[30] Foreign Application Priority Data

Mar. 23, 1996 [DE] Germany .......................... 196 11 610

[51] Int. Cl.[6] ................. H03B 5/36; H03B 5/12
[52] U.S. Cl. ................. 331/116 R; 331/117 R; 331/158; 331/177 V; 331/60
[58] Field of Search ................. 331/36 C, 374, 331/116 R, 116 FE, 117 R, 117 FE, 117 D, 158, 177 V, 60

[56] References Cited

U.S. PATENT DOCUMENTS 5,113,153  5/1992  Soyuer ................. 331/116 R X
5,166,645 11/1992  Watts  ................. 331/37

OTHER PUBLICATIONS

"Oscillator Design Handbook" by Gary A. Breed, published 1990 by Cardiff Publishing Company pp. 55–60.

Primary Examiner—David Mis
Attorney, Agent, or Firm—Jack D. Slobod

[57] ABSTRACT

A Pierce oscillator has been modified to replace the large capacitor with an amplifier element in order to make it more compact. A first amplifier element has a control terminal and a main current path extending between first and second output terminals. A network feeds back the signal at the first output terminal of the first amplifier to the control terminal of the first amplifier element and includes a series-arranged piezoelectric oscillation element. The oscillator also includes a reactive circuit element such as a resonant LC circuit or inductor (herein called an output dipole) coupled to the first output terminal of the first amplifier element and a DC current defining element coupled to the second output terminal of the first amplifier element. The very large capacitor ordinarily required in such a Pierce oscillator to provide a shunt around the DC current defining element at the oscillation frequency is replaced instead by a second amplifier element having a main current path coupled to the second output terminal of the first amplifier element. In a preferred embodiment, positive feedback is provided to the second amplifier element to reduce power consumption and shorten the turn-on transient period.

12 Claims, 1 Drawing Sheet

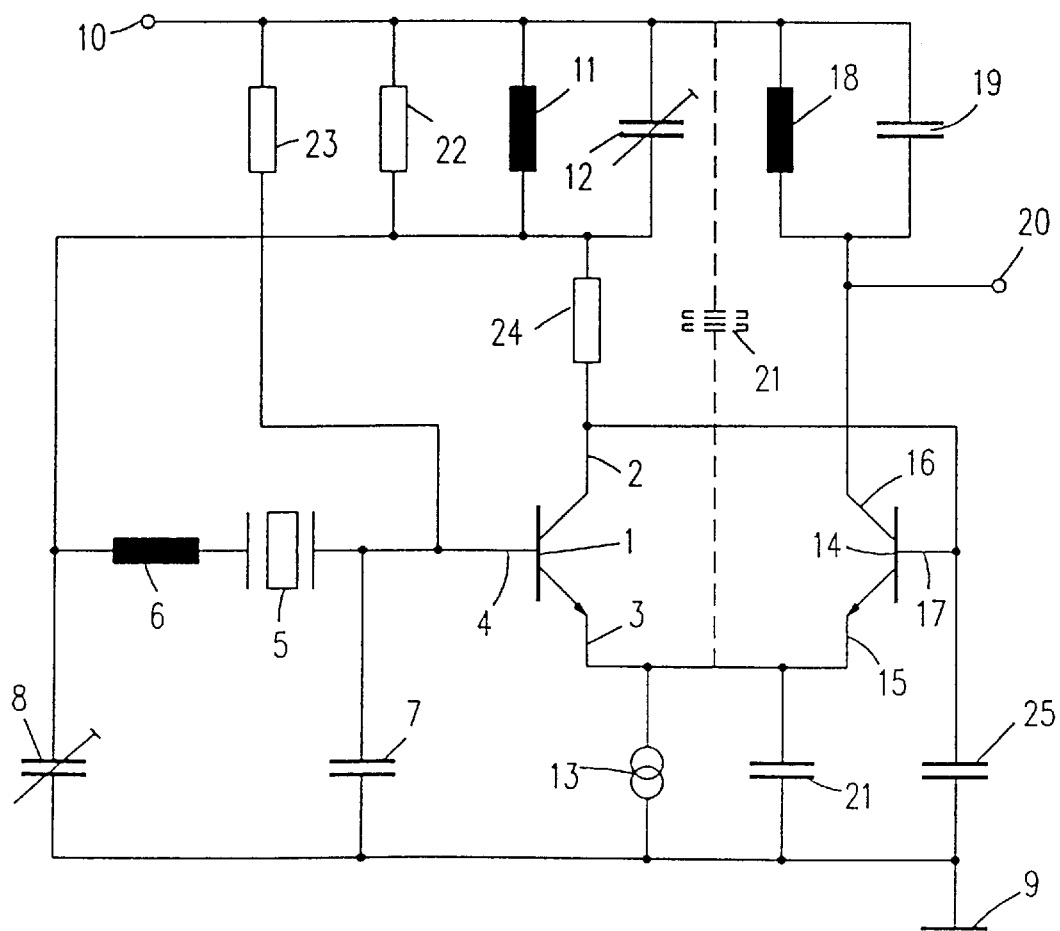

COMPACT CRYSTAL OSCILLATOR HAVING NO LARGE CAPACITOR ELEMENT

BACKGROUND OF THE INVENTION

The invention relates to an oscillator comprising a (first) amplifier element which has a control terminal and a main current path ending in a first and a second output terminal, the oscillator including a network through which the first output terminal of the (first) amplifier element is fed back to the control terminal of the (first) amplifier element by a series-arranged piezoelectric oscillation element, and including a (first) output dipole (i.e., a reactive circuit element, such as a resonant LC circuit or inductor); coupled to the first output terminal of the (first) amplifier element and including a DC current defining element coupled to the second output terminal of the (first) amplifier element. For simplicity, a reactive circuit element will be referred to hereinafter and in the claims as a dipole. A dipole shall be understood to mean a dipolar electrical energy storage element, such as a capacitive, inductive or resonant LC circuit element.

From the monograph "Oscillator Design Handbook" by Gary A. Breed, published 1990 by Cardiff Publishing Company, more particularly pp. 55 to 60, crystal oscillators of various types are known. A so called "Pierce oscillator" has in its simplest embodiment an npn transistor as an amplifier element, whose collector and base are coupled to each other via a crystal (quartz crystal). The collector is furthermore connected via an inductor to a positive supply voltage terminal and represents the output of the "Pierce oscillator". Furthermore are connected to ground the collector of the transistor, via a first capacitor which may be tunable, the base, via a second capacitor and the emitter of the transistor via the parallel circuit of an emitter resistor having a very large capacitance. The base is further connected to the positive supply voltage terminal via a dropping resistor. In a modification, a parallel resonant circuit having an inductor and a—tunably arranged—capacitor capacitor may take the place of the inductor at the collector. This antiresonant circuit can be tuned to the oscillation frequency of the crystal.

This "Pierce oscillator" is designated as having the best frequency stability of all the crystal oscillators discussed in the "Oscillator Design Handbook" it is true, but for a miniaturized integration on a semiconductor body, the very large capacitor in the emitter circuit i.e. between emitter and ground, is highly annoying, because it takes up an unproportionally large space on the semiconductor body. This forms a large hindrance as to the construction, especially for small, light electronic devices such as, for example, radio pagers (pagers).

OBJECTS AND SUMMARY OF THE INVENTION

It is an object of the invention to provide an oscillator, more particularly a so-called "Pierce oscillator" of the design described above, in the way that the described very large capacitor may be omitted.

This object is achieved in an oscillator according to the invention by a second amplifier element which has a main current path ending in a (second) output terminal, this (second) output terminal of the second amplifier element being coupled to the second output terminal of the first amplifier element.

As against the state-of-the-art "Pierce oscillator", the very large capacitor in the oscillator according to the invention, which capacitor is to form a short-circuit to ground for the frequency of the oscillator, is replaced by the impedance of the (second) output terminal of the second amplifier element. This impedance can be set to a low-ohmic value with simple technical measures for the frequency of the oscillator, so that with the oscillator arrangement according to the invention at least substantially a high frequency short-circuit is achieved on the second output terminal of the first amplifier element. This high frequency short-circuit provides that the element defining the DC current is bypassed, which element is connected to the second output terminal and is high-ohmic for the frequency of the oscillator. In the state of the art, the emitter resistor is inserted as an element defining the DC current; but also a current source circuit can take its place. In the oscillator according to the invention, the series combination formed by the first output dipole, the first amplifier element and the DC current defining element is made possible from a supply voltage source via the DC current defining element.

The amplifier elements may preferably be arranged identically, so that a balanced arrangement of the amplifier elements (balanced amplifier) is achieved. With such an arrangement, the high-frequency currents flowing as a result of the oscillation of the oscillator, which currents flow via the supply voltage source in the case of a state-of-the-art "Pierce oscillator", can be largely delayed by this supply voltage source. Since in this push-pull arrangement of the amplifier elements of the oscillator according to the invention the high-frequency currents no longer flow through the supply voltage source, crosstalk of the oscillation in other circuit sections with which the oscillator may have a common supply voltage source may be avoided. The resistance to noise of such arrangements is decisively improved thereby.

With customary dimensioning, a slightly higher impedance for the high-frequency currents is obtained on the (second) output terminal of the second amplifier element than is possible with a very large capacitor. This increased impedance reduces the loop gain of the oscillator compared to the "Pierce oscillator" according to the state of the art, so that when the very large capacitor is replaced by the second amplifier element, a delayed oscillation ratio may occur i.e. the period of time between applying energy from the supply voltage source to the oscillator and the reaching of the transient state of the oscillator may be prolonged. The loop gain of the oscillator is also influenced by the quality i.e. the ratio between the ohmic part and the reactance part of the (first) output dipole, it is true, for example by the quality of the state-of-the-art inductor connected to the collector of the transistor. This quality, however, cannot always be arbitrarily selected for a compensation of a reduced loop gain. In contrast, there is the option of increasing the DC current flowing through the DC current defining element to compensate for the reduction of the loop gain. This measure, however, causes the supply voltage source and a considerable part of the oscillator to be loaded more heavily.

For the described electronic devices, more particularly radio pagers (pagers), mobile telephones and the like, however, oscillators are necessary which are to have not only a high frequency stability, but also a very short transient period (period of time between the application of the energy from the supply voltage source and the reaching of a steady-state condition of the oscillator) and a small power consumption. For example, a radio pager is switched on and off in certain cycles to save current from the supply voltage source, more particularly, a battery. After switch-on, the radio pager must be ready to receive within a few milliseconds. This period of time is determined, in essence, by the transient behavior of the oscillator. On the one hand, the power consumption is reduced by a reduction of the switch-on time, on the other hand, the pager's capability to receive is improved. Furthermore, the oscillator is to have a small power consumption not only during the transient period but also during its next operation so as to load the supply voltage source to the least possible extent. This supply voltage source, for example, a battery, may then be designed small and light, so that a considerable reduction of the size and reduction of the weight of such a radio pager (or other battery-operated electronic devices) becomes possible.

In an oscillator to be used for these electronic devices, a very brief transient period and a very small power consumption is to be strived for. According to a further embodiment of the oscillator according to the invention this is achieved in that a control terminal of the second amplifier element is coupled to the first output terminal of the first amplifier element.

In this further embodiment of the invention, the control terminal of the second amplifier element is included in the feedback of the oscillator (from the first output terminal of the first amplifier element to the control terminal of the first amplifier element). This feedback works as a positive feedback by which the loop gain of the oscillator is increased and the D.C. current in the DC current defining element remains unchanged and thus also the amplitude of the oscillation is increased. The effect of the impedance of the (second) output terminal of the second amplifier element is compensated as a result, without causing a heavier load on the supply voltage source and oscillator.

At this point there may be observed that from "Halbleiter-Schaltungstechnik" by U. Tietze and Ch. Schenk, 8th Vol. Spinger Verlag 1986, emitter-coupled oscillators having two npn transistors are known. The collector of one of the transistors is then directly coupled to the base of the other transistor and via an LC blocking circuit led to a reference potential. This circuit does not include a quartz crystal. An emitter-coupled oscillator having crystal stabilization implies a coupling of the collector of one transistor via an additional amplifier stage and the quartz crystal to the base of the other transistor to which also the LC blocking circuit is connected. None of these arrangements corresponds to the oscillator according to the invention and, therefore, does not have its advantages.

In a further embodiment of the oscillator according to the invention, a first output terminal of the second amplifier element, in which the other side of the main current path of the second amplifier element ends, is coupled to a second output dipole. In this manner there is a series combination formed by the main current path of this second amplifier element and the second output dipole. Advantageously, the series combination may be arranged in parallel with the series combination formed by the main current path of the first amplifier element and the first output dipole between a supply voltage terminal and the DC current defining element. Compared with the "Pierce oscillator", an oscillation to be produced by the oscillator according to the invention may then also be tapped from the second output dipole.

An advantageous further embodiment of the oscillator according to the invention may be achieved in that the impedances of the output dipoles have a resonance characteristic. More particularly, the output dipoles may be arranged as a blocking circuit. Oscillations having frequencies to which the output dipoles are tuned may then be tapped from the output dipoles.

With the "Pierce oscillator" according to the state of the art there is to be taken into account that the blocking circuit to be used as an output dipole is to be tuned to the oscillation frequency of the piezoelectric oscillation element. This reduces the application possibility of the "Pierce oscillator" for high frequency use in so far as high frequency oscillations can only be generated with additional circuitry, which oscillations can be derived from multiples of the oscillation frequency of the piezoelectric oscillation element. For obtaining an oscillation with a multiple -of the oscillation frequency of the piezoelectric oscillation element, the state-of-the-art "Pierce oscillator" is to be followed by a frequency multiplier. The consequent circuitry and power consumption is undesired for the said, light electronic devices.

The previous further embodiment of the oscillator according to the invention in which the output dipoles are arranged as blocking circuits, there is, however, the possibility of generating high frequency oscillations with very little circuitry. For this purpose, the first output dipole is tuned to the frequency of a first-harmonic oscillation or a harmonic oscillation of the piezoelectric oscillation and the second output dipole is tuned to a harmonic of the resonant frequency of the first output dipole. The first-harmonic oscillation of the piezoelectric oscillation circuit is then the oscillation of the unconnected piezoelectric oscillation element.

With this embodiment it is possible to derive in a simple manner an oscillation having a very high frequency from a piezoelectric oscillation element that has a first-harmonic oscillation of a proportionally low frequency. For this purpose, the oscillator loop i.e. the components of the oscillator which are included in the feedback path from the first output terminal of the first amplifier element to its control terminal, is tuned to the desired oscillation frequency of the piezoelectric oscillation element. In addition to the piezoelectric oscillation element itself, also the first output dipole and the network containing the piezoelectric oscillation element belong thereto. Especially the first output dipole, as already observed, in its function as a blocking circuit can be tuned to the oscillation frequency of the piezoelectric oscillation element, because otherwise the oscillation of the first output terminal of the first amplifier element is short-circuited via the supply voltage source and thus the feedback is degraded. The first amplifier element may then preferably be driven to full capacity preferably up to non-linear regions of its transmission function i.e. the function between the signals on the control terminal and on the output terminals. This favorably affects the generation of harmonic oscillations i.e. harmonics of the first-harmonic oscillation of the unconnected piezoelectric oscillation element.

The circuit branch including the main current path of the second amplifier element and the second output dipole is decoupled from the loop having the feedback via the first amplifier element and the network. This provides that the second output dipole may be tuned both to the same frequency as the first output dipole and to a harmonic thereof, without degrading effects on the operational behavior of the oscillator. Therefore, with appropriate tuning, a harmonic oscillation of the oscillation frequency of the piezoelectric oscillation element and thus of the first output dipole can be tapped from the second output dipole. Since the second output dipole can also be tuned to the frequency of the first-harmonic oscillation of the piezoelectric oscillation element in the unconnected state or to the frequency of the oscillator, i.e. the resonant frequency of the first output dipole without degrading effects on the operational behavior of the oscillator, oscillations can also be tapped from the second output dipole with these frequencies.

The push-pull arrangement formed by the amplifying elements of the oscillator according to the invention predominantly generates odd harmonics of the oscillation frequency of the piezoelectric oscillation element in the case of identical branches running via the main current paths and the output dipoles i.e. odd harmonics of the oscillation frequency with which the piezoelectric oscillation element oscillates when the oscillator is in operation. Only as a result of asymmetries in the structure or in the dimensioning will also even harmonics arise because the amplifier elements are driven to full capacity in a non-linear manner. If, on the other hand, such an even harmonic is to be generated, according to a further embodiment of the invention a bridging element is connected in parallel to the element defining the DC current. For the oscillation to which the second output dipole is tuned and which in this case represents an even harmonic, this is a low-ohmic bridging element. Advantageously, this bridging element is formed by a capacitor, but may also be arranged as an ohmic resistance or as an RC element.

In a modification of said further embodiment of the oscillator according to the invention the bridging element is inserted between the second output terminals of the amplifier elements and the poles of the output dipole which are facing away from the amplifier elements. As against a direct parallel combination with the element defining the DC current, there is the advantage that also the even harmonic high-frequency currents flowing through the bridging element are kept away from the supply voltage source; the circuit for these currents is closed by the amplifier elements and the output dipoles via the bridging element, without the insertion of the supply voltage source. The bridging elements may be dimensioned more unrestrictedly and may particularly have a more low-ohmic design without resulting in additional crosstalk of high-frequency currents in the supply voltage source.

The network by which the feedback to the first amplifier element is realized in the oscillator according to the invention, preferably comprises two capacitive dipoles of which a first dipole is connected, on one side to the control terminal and the second dipole on one side to the first output terminal of the first amplifier element and which are connected on the other side to a DC defining element pole facing away from the first amplifier element. Preferably the second capacitive dipole of these capacitive dipoles which are, in essence, already present in the "Pierce oscillator" is tunably arranged. Optionally, the first output dipole may comprise a capacitive element which is tunably arranged.

The resonant frequency of the output dipole and thus the oscillation frequency of the oscillator can be adjusted by tuning the second capacitive dipole of the network or the capacitive element in the first output dipole. This adjustment or a "pulling" of the frequency of the oscillator can also be effected electronically via a setting signal by appropriately forming the second capacitive dipole of the network or the capacitive element in the first output dipole.

A comparison between the "Pierce oscillator" according to the state of the art with the oscillator according to the invention shows that the "Pierce oscillator" gives maximum feedback and thus a maximum oscillation amplitude when the impedance of the piezoelectric oscillation element is minimized. Conversely, the largest oscillation amplitude between the control terminals of the amplifier elements in the oscillator according to the invention occurs when the impedance of the piezoelectric oscillation element assumes its highest value, whereas this impedance short-circuits the control terminals of the amplifier elements when it is minimized. This means that when a quartz crystal is used as a piezoelectric oscillation element, the "Pierce oscillator" oscillates with the series resonance of the oscillation circuit, whereas the oscillator according to the invention oscillates with the parallel resonance of the quartz crystal. From "Halbleiter-Schaltungstechnik" by U. Tietze and Ch. Schenk, 8th Vol., 1986, section 15.2.1 is known that the oscillation frequency of a quartz crystal can be pulled by simply inserting a capacitor between the series resonance and the parallel resonance. The parallel resonance then particularly strongly depends on the housing capacitor of the quartz crystal and is thus subjected to the manufacturing tolerances.

Alternatively, the oscillator according to the invention in a simple high-frequency equivalent circuit may be considered a combination of an amplifier which has a negative internal resistance on the output and a reactance as a load resistance, while this reactance is generally arranged as a capacitive load. The value of this capacitive load in the equivalent circuit is determined by the number and position of the poles of the transfer function of the oscillator loop. The capacitive load will then be larger as the cut-off frequencies if this equivalent circuit are lower. Conversely, the oscillation frequency of the circuit arrangement is reduced when the capacitive load in this equivalent circuit is increased.

The parallel resonant frequency in the quartz crystal is higher than the series resonant frequency. Thus, when an oscillator comprising a quartz crystal can assume different frequencies as a result of different capacitive loads, these frequencies will change, on the one hand, only between the series resonant frequency and the parallel resonant frequency and, on the other hand, with a small capacitive load, the oscillator will oscillate in the neighborhood of the parallel resonant frequency i.e. of the higher frequency. In that case i.e. with a small capacitive load, the frequency of the oscillator strongly depends on the tolerances of the housing capacitor of the quartz crystal.

Such a tolerance of the oscillation frequency is unacceptable for most applications of the oscillator according to the invention. For example, for the use in radio pagers, mobile telephones and so on, the oscillation frequency to be set is precisely to be adhered to. This means that either a very precisely made and thus very expensive quartz crystal is to be used, or that there must be a possibility to configure the oscillator according to the invention within a certain frequency range to compensate for manufacturing tolerances (referenced oscillator pulling). Preferably, with the oscillator according to the invention, this adjustment may be effected by a tuning of the second capacitive dipole of the network and/or of the capacitive element in the first output dipole. The second capacitive dipole or the capacitive element respectively, may then be used as trimming capacitors.

However, to become even more independent of said tolerances of the housing capacitor of a quartz crystal, it is desired in the oscillator according to the invention to select the oscillation frequency nearest possible to the series resonance of the quartz crystal and thus also the frequency range within which the oscillator according to the invention is to be adjustable (pulling range) nearest possible to the series resonant frequency of the quartz crystal. It appears that this is only possible when the capacitance of the first capacitive dipole of the network is increased. By increasing this capacitance, the control terminal of the first amplifier element is short-circuited more strongly to the DC defining element pole facing away from the first amplifier element, it is true, so that a push-pull control of the amplifier elements is increased and thus also the amplitude of the oscillation of the oscillator is increased. Alternatively, the gain inside the feedback loop which is formed by the piezoelectric oscillation element and the link between the control terminal and the first output terminal of the first amplifier element diminishes accordingly. When the capacitance of the first capacitive dipole of the network is increased, a point is exceeded at which an oscillation determined by the feedback from the first output terminal of the first amplifier element to the control terminal of the second amplifier element outweighs the oscillation determined by the piezoelectric oscillation element. The capacitance in the first capacitive dipole of the network thus cannot be increased at will.

To shift the pulling range in the direction of the series resonance of the quartz crystal without increasing the capacitance of the first capacitive dipole of the network with the oscillator according to the invention, and, more particularly, to certainly exclude the described parasitic oscillation in the circuit between the first output terminal of the first amplifier element and the control terminal of the second amplifier element, a low-pass element whose cut-off frequency is higher than the frequency to which the first output dipole is tuned is inserted into the feedback path from the first output terminal of the first amplifier element to its control terminal in a further embodiment of the invention. By accordingly selecting the cut-off frequency of this low-pass element, said parasitic oscillation can be reliably attenuated.

The insertion of the low-pass element provides that the transfer function of the negative feedback loop of the oscillator according to the invention in its high frequency equivalent circuit has an additional pole and thus an additional phase turn. As a result, the capacitive load in the high frequency equivalent circuit can be increased without increasing the capacitance of the first capacitive dipole of the network. In the oscillator according to the invention, the low-pass element decouples the loop running via the piezoelectric oscillation element from the loop running via the first output terminal of the first amplifier element and the control input of the second amplifier element.

Advantageously, the low-pass element comprises an ohmic element which is inserted into the link between the first output terminal of the first amplifier element and the network and also between the first output dipole and a capacitive element, which capacitive element is connected between the first output terminal of the first amplifier element and the DC defining element pole facing away from the first amplifier element.

DETAILED DESCRIPTION OF THE PREFERRED EMBODIMENTS

The Figure shows an exemplary embodiment of the oscillator according to the invention. It comprises an npn transistor as a first amplifier element 1, whose collector emitter path ends as a main current path in a first output terminal 2 (collector) and a second output terminal 3 (emitter), and whose base forms a control terminal 4. The first output terminal 2 of the first amplifier element 1 is fed back to the control terminal 4 via a network which includes a series-arranged piezoelectric oscillation element 5 which is preferably a quartz crystal. The network 5 in the Figure further includes a series inductor 6 combined in series with the piezoelectric oscillation element 5 and two capacitive dipoles 7 and 8 in the example according to the invention formed by simple capacitors either as discrete elements or in integrated form on a semiconductor body. The first capacitive dipole 7 is connected on one side to the control terminal 4, the second capacitive dipole 8 is connected on one side to the first output terminal 2. On the other side, the capacitive dipoles 7, 8 are connected to ground 9 which forms a supply voltage terminal in the Figure.

A (second) supply voltage terminal 10, by which the oscillator is supplied with a supply voltage which is positive compared to ground 9, is connected to a pole of a first output dipole which comprises a first inductor 11 and a capacitive element 12 and with these elements is arranged as a blocking circuit. This blocking circuit is tuned to the frequency of the oscillator i.e. of the piezoelectric oscillation element for which purpose the capacitive element 12 may optionally be arranged as a trimming capacitor. A pole facing away from the (second) supply voltage terminal 10 of the first output dipole 11, 12 is coupled to the first output terminal 2.

A DC defining element 13, in the present example arranged as a constant current source is connected to the second output terminal 3 of the first amplifier element 1. The DC defining element 13 is connected with a second pole to ground 9 and represents a high impedance, ideally a no-load impedance for high-frequency currents.

A second amplifier element 14 formed by an npn transistor is connected with its second output terminal 15 (emitter) to the second output terminal 3 of the first amplifier element 1. A control terminal 17 (base) of the second amplifier element 14 is connected to the first output terminal 2 of the first amplifier element 1. Furthermore, a link is made between a first output terminal 16 of the second amplifier element 14 and a second output dipole, which dipole comprises a second inductor 18 and a second capacitive element 19. On the other side, the second output dipole 18, 19 is connected to the (second) supply voltage terminal 10. The second output dipole forms a blocking circuit which is tuned to the frequency of the oscillation to be produced by the oscillator, which frequency may be a harmonic of the oscillation frequency of the piezoelectric oscillation element 5. Accordingly, the node between the first output terminal 16 and the second amplifier element 14 and the second output dipole 18, 19 is arranged as an oscillator output 20. Just like the capacitive element 12 of the first output dipole, also the second capacitive element 19 may be arranged as a trimming capacitor for an adjustment of the oscillator, which, however, is not separately shown in the Figure.

Also in the second amplifier element 14, the npn transistor in the exemplary embodiment shown in the Figure, the collector emitter path forms a main current path of the second amplifier element 14.

In parallel with the DC defining element 13 is arranged a bridging element 21 which has a low-ohmic value for the oscillation to which the second output dipole 18, 19 is tuned. In the exemplary embodiment shown in the Figure the bridging element 21 is formed by a capacitor. Optionally, the bridging element 21 of the connection between the DC defining element 13 and the second output terminals 3, 15 of the amplifier elements 1, 14 may also be connected to the (second) supply voltage terminal 10 instead of ground 9. This is shown in a dashed line in the Figure. In both cases the bridging element 21 closes a current circuit for the high-frequency currents through the amplifier elements 1, 14 and the output dipoles 11, 12; 18, 19, respectively. The arrangement of the amplifier elements 1, 14 with ideal symmetry does not produce even harmonics of the oscillation frequency of the piezoelectric oscillation element. On the node between the two output terminals 3, 15 of the amplifier elements 1, 14 the DC voltage of the oscillation frequency is developed during operation. The low-ohmic path formed by the bridging element 21 provides that it is also possible to add an even harmonic even when the amplifier elements 1, 14 are arranged symmetrically.

The series inductor 6 connected in series to the piezoelectric oscillation element 5 changes the impedance of the piezoelectric oscillation element 5 in the network in such a way that the oscillation frequency of the piezoelectric oscillation element is reduced compared with the case where the oscillation element is not in operation. In a modification of the oscillator shown in the Figure, the series inductor 6 may be omitted. Furthermore, the oscillation frequency may also be reduced by changing the geometry of the piezoelectric oscillation element.

A parallel attenuation resistor 22 is added to the first output dipole 11, 12 in the exemplary embodiment shown in the Figure, which resistor attenuates the resonance circuit formed by the first output dipole 11, 12, so that the circuit resonant frequency does not dominate the oscillations of the piezoelectric oscillation element.

A base resistor 23 is used for supplying DC power to the control terminal 4 of the first amplifier element 1.

The oscillator shown in the Figure further comprises a low-pass element which is inserted into the feedback path from the first output terminal 2 of the first amplifier element 1 to its control terminal 4 and whose cut-off frequency is higher than the frequency to which the first output dipole is tuned. This low-pass element, in the Figure formed by an ohmic element 24 and a capacitive element 25, thus forms a restriction for the afore-said feedback path, but attenuates parasitic oscillations of a loop which includes the amplifier elements 1, 14 with their feedback path running from the first output terminal 2 of the first amplifier element 1 to the control terminal 17 of the second amplifier 14, a housing capacitor of the piezoelectric oscillation element 5, the first capacitive dipole 7 of the network and the bridging element 21. In addition, the ohmic element 24 is inserted into the connection between the first output terminal 2 of the first amplifier element 1, on the one hand, and the network 5 to 8 and the first output dipole 11, 12, on the other hand. The capacitive element 25 is connected to the first output terminal 2 of the first amplifier element 1 and the pole facing away from the first amplifier element 1 of the DC defining element 13 i.e. to ground 9.

The oscillator according to the invention has a simple structure and can to a large extent be simply integrated on a semiconductor body, so that only few external components and thus few pins of the integrated circuit are needed in addition to this semiconductor body. The oscillator according to the invention has a very low power consumption level and can be operated with very low supply voltages. When a supply voltage is applied, a stable oscillation will be produced on the output (oscillator output 20 in the Figure) after a very brief transient period. Even with a frequency mistuning of the oscillator, this very brief transient period does not change, in essence. In the start mode i.e. when the oscillator is taken into operation after the supply voltage has been applied, the oscillator first starts oscillating via the cross-coupled amplifier elements (which form a negative resistance) from the first output terminal of the first amplifier element to the control terminal of the second amplifier element and the LC circuit of the first output dipole. This oscillation is accelerated by the cross-coupling, which leads to an increase of the impedance on the first output terminal of the first amplifier element and thus to an increase of the loop gain of the oscillator compared with a "Pierce oscillator". The value of the first output dipole (if applicable, including a parallel attenuation resistance) is so low that the oscillator without a piezoelectric oscillation element would oscillate as weakly. The first output dipole is tuned to a frequency which at least largely corresponds to the oscillation frequency of the piezoelectric oscillation element; the low value of the first output dipole may lead to the fact that the output dipole oscillation frequency can easily be determined by the piezoelectric oscillation element. In the starting phase, the oscillation of the first output dipole excites the piezoelectric oscillation element and the oscillator loop closed thereby, after which the piezoelectric oscillation element takes over the defining of the frequency i.e. starts oscillating in a predominating fashion.

The high-frequency currents in the main current paths of the amplifier elements have the oscillation frequency of the piezoelectric oscillation element and its harmonic. From these frequencies, any frequency may optionally be filtered out via the second output dipole, also the first-harmonic oscillation or oscillation frequency respectively, of the piezoelectric oscillation element itself, because the second output dipole is decoupled from the oscillator loop. Its oscillation behavior is not affected thereby. Furthermore, high-frequency currents flow only in the amplifier elements and the output dipoles or optionally in the bridging element. On the other hand, only slight high-frequency currents are conveyed to the supply voltage terminals via the network.

I claim:

1. An oscillator comprising a amplifier element having a control terminal and a main current path extending between a first output terminal and a second output terminal thereof, the oscillator including a network through which a voltage at the first output terminal of the amplifier element is fed back to the control terminal of the amplifier element by a series-arranged piezoelectric oscillation element, a output dipole coupled to the first output terminal of the amplifier element, a DC current defining element coupled to the second output terminal of the amplifier element, and a second amplifier element having a main current path extending between a first output terminal and a output terminal thereof, the second output terminal of the second amplifier element being coupled to the second output terminal of the first amplifier element and the second amplifier providing a short-circuit bypass of the DC current defining element at the frequency of the oscillator.

2. An oscillator as claimed in claim 1, characterized in that the network comprises two capacitive dipoles, a first one of which is coupled on one side to the control terminal and the second one of which is coupled on one side to the first output terminal of the first amplifier element, the two capacitive dipoles each being connected on the other side thereof to a pole of the DC defining element facing away from the first amplifier element.

3. An oscillator as claimed in claim 2, characterized in that the second capacitive dipole of the network is tunable and in that the first output dipole comprises a capacitive element which is tunable.

4. An oscillator comprising a first amplifier element having a control terminal and a main current path extending between a first output terminal and a second output terminal thereof, the oscillator including a network through which a voltage at the first output terminal of the first amplifier element is fed back to the control terminal of the first amplifier element by a series-arranged piezoelectric oscillation element, a first output dipole coupled to the first output terminal of the first amplifier element, a DC current defining element coupled to the second output terminal of the first amplifier element, and a second amplifier element having a main current path extending between a first output terminal and a second output terminal thereof, the second output terminal of the second amplifier element being coupled to the second output terminal of the first amplifier element and a control terminal of the second amplifier element being coupled to the first output terminal of the first amplifier element.

5. An oscillator as claimed in claim 4, characterized in that the first output terminal of the second amplifier element is coupled to a second output dipole.

6. An oscillator as claimed in claim 5, characterized in that the impedances of the output dipoles have a resonance characteristic.

7. An oscillator as claimed in claim 6, characterized in that the respective output dipoles are arranged to block current flow between a supply voltage source and the first output terminal of the first and second amplifiers respectively.

8. An oscillator as claimed in claim 7, characterized in that the first output dipole is tuned to the frequency of a first-harmonic oscillation of the piezoelectric oscillation element and in that the second output dipole is tuned to a harmonic oscillation of the resonant frequency of the first output dipole.

9. An oscillator as claimed in claim 8, characterized by a high-frequency bridging element arranged in parallel with the DC defining element, which bridging element is a low-ohmic element for the oscillation to which the second output dipole is tuned.

10. An oscillator as claimed in claim 9, characterized in that the bridging element is inserted between the second output terminals of the amplifier elements and the output dipole poles facing away from the amplifier elements.

11. An oscillator as claimed in claim 8, characterized in that a low-pass element whose cut-off frequency is higher than the frequency to which the first output dipole is tuned is inserted into the feedback path from the first output terminal of the first amplifier element to its control terminal.

12. An oscillator as claimed in claim 11, characterized in that the low-pass element comprises: an ohmic element which is inserted into the link between the first output terminal of the first amplifier element and the network and also between the first output dipole and a capacitive element, which capacitive element is connected between the first output terminal of the first amplifier element and a pole of the DC defining element facing away from the first amplifier element.

* * * * *